(12) United States Patent
Ke et al.

(10) Patent No.: US 11,508,610 B2
(45) Date of Patent: Nov. 22, 2022

(54) SUBSTRATE SUPPORT WITH EDGE SEAL

(71) Applicant: APPLIED MATERIALS, INC., Santa Clara, CA (US)

(72) Inventors: Chang Ke, Sunnyvale, CA (US); Bonnie Chia, Sunnyvale, CA (US); Song-Moon Suh, San Jose, CA (US); Cheng-Hsiung Tsai, Cupertino, CA (US); Yuanhong Guo, Mountain View, CA (US); Lei Zhou, Santa Clara, CA (US); David Langtry, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 371 days.

(21) Appl. No.: 16/388,308

(22) Filed: Apr. 18, 2019

(65) Prior Publication Data

US 2019/0326152 A1    Oct. 24, 2019

Related U.S. Application Data

(60) Provisional application No. 62/660,230, filed on Apr. 19, 2018.

(51) Int. Cl.
| | |
|---|---|
| *C23C 16/02* | (2006.01) |
| *C23C 16/455* | (2006.01) |
| *C23C 16/458* | (2006.01) |
| *H01L 21/02* | (2006.01) |
| *H01L 21/67* | (2006.01) |
| *H01L 21/687* | (2006.01) |

(52) U.S. Cl.
CPC .... *H01L 21/68721* (2013.01); *C23C 16/0227* (2013.01); *C23C 16/4557* (2013.01); *C23C 16/4585* (2013.01); *C23C 16/45565* (2013.01); *H01L 21/0209* (2013.01); *H01L 21/6719* (2013.01); *H01L 21/67028* (2013.01); *H01L 21/67051* (2013.01); *H01L 21/67126* (2013.01); *H01L 21/68735* (2013.01)

(58) Field of Classification Search
None
See application file for complete search history.

(56) References Cited

U.S. PATENT DOCUMENTS

| | | | |
|---|---|---|---|
| 7,159,599 | B2 | 1/2007 | Verhaverbeke et al. |
| 7,198,677 | B2 | 4/2007 | Yoo |
| 2007/0181149 | A1 | 8/2007 | Ko et al. |
| 2008/0213978 | A1 | 9/2008 | Henry et al. |
| 2010/0240222 | A1* | 9/2010 | Fyten ............... H01L 21/68721 438/745 |

* cited by examiner

*Primary Examiner* — Levon J Shahinian
(74) *Attorney, Agent, or Firm* — Moser Taboada

(57) ABSTRACT

Methods and apparatus for supporting a substrate are provided herein. In some embodiments, a substrate support to support a substrate having a given diameter includes: a base ring having an inner diameter less than the given diameter, the base ring having a support surface configured to contact a first surface of the substrate and to form a seal between the support surface and the first surface of the substrate, when disposed atop the base ring; and a clamp ring having an inner diameter less than the given diameter, wherein the clamp ring includes a contact surface proximate the inner diameter configured to contact an upper surface of the substrate, when present, and wherein the clamp ring and the base ring are further configured to provide a bias force toward each other to clamp the substrate in the substrate support.

18 Claims, 2 Drawing Sheets

SUBSTRATE SUPPORT WITH EDGE SEAL

CROSS-REFERENCE TO RELATED APPLICATIONS

This application claims benefit of U.S. provisional patent application Ser. No. 62/660,230, filed Apr. 19, 2018 which is herein incorporated by reference in its entirety.

FIELD

Embodiments of the present disclosure generally relate to substrate processing equipment, and more specifically to substrate supports for use in substrate processing equipment.

BACKGROUND

In semiconductor device manufacturing, processing tools often require physical contacts to a substrate backside, e.g., handling by robot blades, electrostatic or vacuum chucking and clamping, or the like. Such physical contact with the substrate tends to cause particles of various sizes to be generated and attach to the backside of the substrate. The particle-contaminated backside could cause cross-substrate contamination, which leads to device yield loss. In some sensitive processes, for example, lithography, the existence of backside particles can cause a focusing issue called hotspot, which leads to inaccuracies and defects in the photolithography process.

Accordingly, the inventors have provided embodiments of improved substrate supports.

SUMMARY

Methods and apparatus for supporting a substrate are provided herein. Embodiments of substrate supports disclosed herein advantageously provide improved protection for a front side of a substrate, for example, during processes for cleaning a backside of the substrate, such as via a cryogenic aerosol jet. In some embodiments, a substrate support to support a substrate having a given diameter includes: a base ring having an inner diameter less than the given diameter, the base ring having a support surface configured to contact a first surface of the substrate and to form a seal between the support surface and the first surface of the substrate, when disposed atop the base ring; and a clamp ring having an inner diameter less than the given diameter, wherein the clamp ring includes a contact surface proximate the inner diameter configured to contact an upper surface of the substrate, when present, and wherein the clamp ring and the base ring are further configured to provide a bias force toward each other to clamp the substrate in the substrate support.

In some embodiments, a substrate support to support a substrate having a given diameter includes a base ring having an inner diameter less than the given diameter, the base ring having a support surface configured to contact a first surface of the substrate and to form a seal between the support surface and the first surface of the substrate, when disposed atop the base ring; and a clamp ring disposed above the base ring and having an angled contact surface configured to contact an upper surface of the substrate, wherein each of the clamp ring and the base ring includes one or more magnets configured to provide an attractive force between the base ring and the clamp ring to clamp the substrate in the substrate support.

In some embodiments, a process chamber for cleaning a backside of the substrate includes a substrate support that separates an interior volume of the process chamber into an upper volume disposed above the substrate support and a lower volume disposed below the substrate support, wherein the substrate support includes a base ring having an inner diameter less than a given diameter of the substrate and a support surface configured to form a seal between the support surface and a first surface of the substrate when disposed atop the base ring, and a clamp ring having an inner diameter less than the given diameter, wherein the clamp ring includes a contact surface configured to contact an upper surface of the substrate, and wherein the clamp ring and the base ring are further configured to provide a bias force toward each other to clamp the substrate in the substrate support; and a cryogenic cleaning apparatus disposed in the lower volume and configured to provide a stream of cleaning materials toward the backside of the substrate to be cleaned, wherein the cryogenic cleaning apparatus includes a movable arm and a nozzle.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
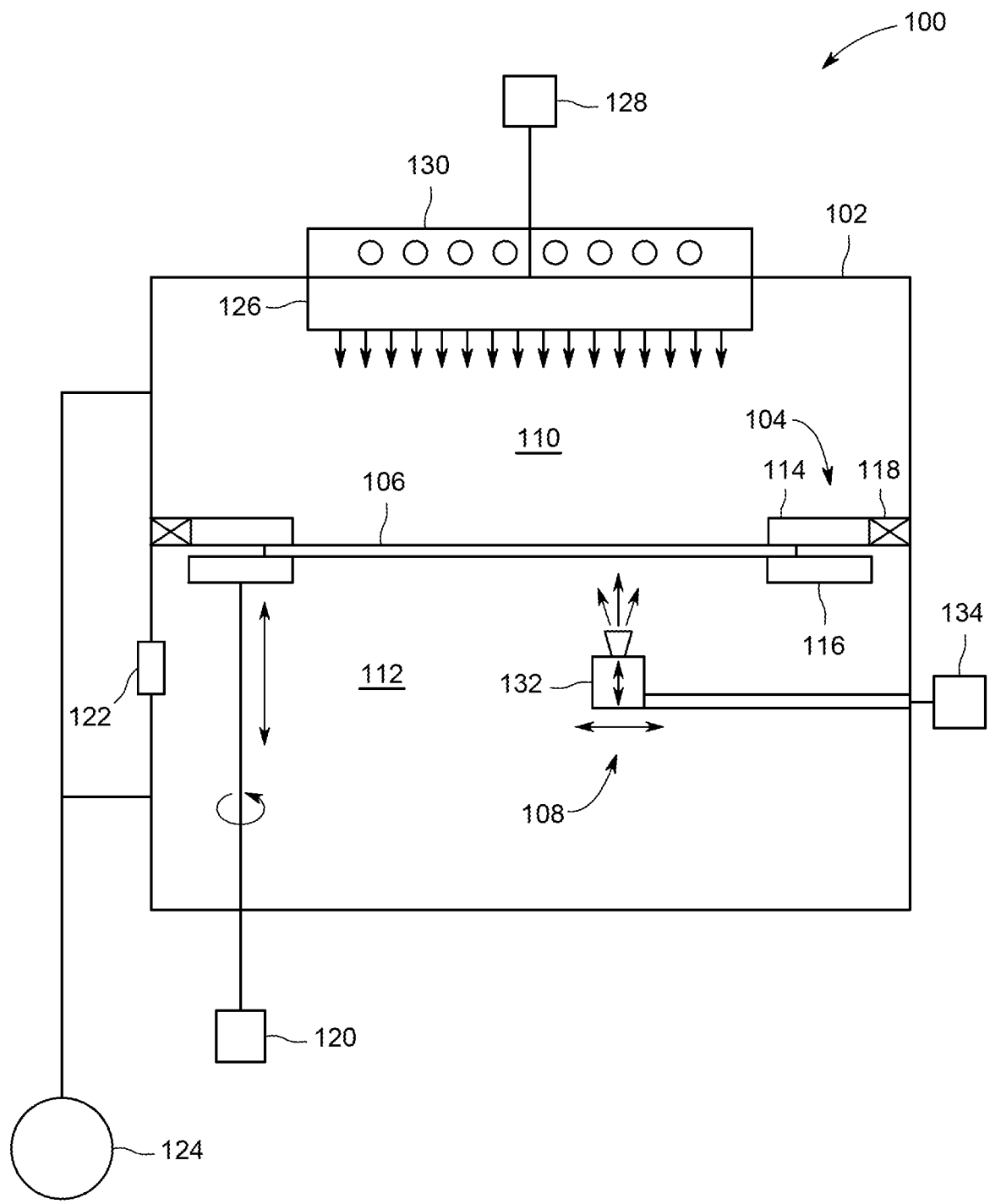
FIG. 1 is a schematic view of an exemplary process chamber configured for a cryogenic substrate cleaning process and having a substrate support in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for supporting a substrate are provided herein. Embodiments of substrate supports disclosed herein advantageously provide improved protection for a front side of a substrate, for example, during processes for cleaning a backside of the substrate, such as via a cryogenic aerosol jet. Advantages of the disclosed embodiments include limiting or prevention of contamination of a front side of the substrate during backside processing. In some embodiments, the substrate may further be heated to limit or prevent condensation type contaminants from forming on the front side of the substrate.

FIG. 1 is a schematic view of an exemplary system 100 including a process chamber configured for a cryogenic substrate cleaning process and having a substrate support in accordance with at least some embodiments of the present disclosure. The process chamber is advantageously configured to perform a cryogenic aerosol jet cleaning method to effectively remove substrate backside particles while minimizing any front side contamination of the substrate. The cryogenic cleaning method advantageously overcomes several problems with conventional wet cleaning methods observed by the inventors: namely, reduction in cleaning efficiency as particle sizes becomes smaller, harmfulness of chemical process to some sensitive devices, and difficulty of integration with vacuum process tools for inline cleaning. While advantageous for use in connection with cryogenic cleaning processes, embodiments of the substrate support as disclosed herein may be incorporated into other process chambers and used for other processes as well. The system 100 can be a standalone system or can be integrated into a vacuum processing tool such as a multi-chamber processing tool, or cluster tool.

As illustrated in FIG. 1, in some embodiments, the system 100 includes a process chamber 102 having a substrate support 104 disposed therein for supporting a substrate 106 during processing. The substrate support 104 separates the interior volume of the process chamber 102 into an upper volume 110 disposed above the substrate support 104 and a lower volume 112 disposed below the substrate support 104. The upper and lower volumes 110, 112 are substantially isolated from each other when the substrate 106 is present.

A cryogenic aerosol cleaning apparatus 108 is disposed in the lower volume and positioned to provide a stream of gaseous and solid phase cleaning materials toward a surface of the substrate 106 to be cleaned (e.g., the backside of the substrate 106). The cryogenic aerosol cleaning apparatus 108 is configured move at least laterally (e.g., horizontally in the configuration shown in the drawing) to provide the stream of gaseous and solid phase cleaning materials to various portions of the backside of the substrate 106. In some embodiments, the cryogenic aerosol cleaning apparatus 108 is configured move sufficiently to provide the stream of gaseous and solid phase cleaning materials to the entire backside of the substrate 106. In some embodiments, the cryogenic aerosol cleaning apparatus 108 is configured move sufficiently to provide the stream of gaseous and solid phase cleaning materials to only a portion of the backside of the substrate 106 and the substrate support 104 is configured to rotate such that the entire backside can be cleaned.

For example, the cryogenic aerosol cleaning apparatus 108 includes a nozzle 132 coupled to a moveable arm. The moveable arm is coupled to an actuator to facilitate movement of the movable arm. The movable arm is configured to move the nozzle 132 at least between a center and an outer peripheral edge of the substrate 106. In combination with rotation of the substrate 106, such a configuration facilitates directing cleaning materials to all portions of the side of the substrate 106 to be cleaned.

In some embodiments, the nozzle 132 may be positionable at a distance of about 0.5 to about 2 inches away from the first side of the substrate 106. The distance may be controlled to control the cleaning efficiency of the process. For example, the shorter the distance, the greater the cleaning force, which facilitates removing tougher particles or smaller particles. However, at shorter distances, the cleaning efficiency is lower (e.g., the area of the stream impinging on the substrate is smaller). At further distances, the cleaning area is increased, but the force of impact of the cleaning materials is lessened.

The nozzle 132 is coupled to a cleaning material source 134. The nozzle 132 is configured to discharge a mixture comprising solid particles entrained in a stream of gas to the backside of the substrate 106. For example, the nozzle 132 can be a convergent-divergent, or de Laval nozzle, configured to create a cryogenic aerosol from the cleaning materials provided by the cleaning material source 134. The cryogenic aerosol includes solid phase cryogenic gas clusters that are created and accelerated when passing through the nozzle 132.

The cleaning materials provided by the cleaning material source can be liquid carbon dioxide ($CO_2$), nitrogen ($N_2$), argon (Ar), neon (Ne), or the like. The cleaning materials may be provided to the nozzle 132 through a flexible metal gas conduit, such as a stainless steel corrugated hose. In some embodiments, the metal gas conduit is provided without any liner material, or without any plastic liner material lining the interior surfaces of the conduit. The inventors have observed that the carbon dioxide can attack and wear down the plastic liner inside the gas conduit, leading to particle contamination of the cleaning gas stream and, ultimately, of the substrate.

Alternatively or in combination, in some embodiments, the cleaning materials pass through a filter (e.g., a nickel mesh filter) to advantageously remove gross particulates from the cleaning material stream prior to discharge from the nozzle 132. The filter has a pore size sufficient to filter out particles greater than about 3 nanometers in size.

The substrate support 104 is configured to hold a substrate 106 with a first side of the substrate (e.g., a bottom side, typically the backside of the substrate) exposed to the cryogenic aerosol cleaning apparatus 108, while protecting a second side of the substrate opposite first side (e.g., a top side, typically the front side of the substrate 106). The substrate 106 may be any suitable substrate used in a semiconductor or similar thin-film manufacturing processes, such as circular, square, rectangular, or other shaped substrates of various materials. In some embodiments, the substrate 106 may be a semiconductor wafer (e.g., a 200 mm, 300 mm, 450 mm, or the like silicon wafer).

The substrate 106 to be cleaned generally includes a contaminated first side and an uncontaminated second side, opposite the first side. The substrate support is configured to support a substrate having a given diameter. For example, the dimensions of the substrate support elements will vary depending upon the size and configuration of the substrate 106 (e.g., a round wafer or a square panel, 200 mm diameter or 300 mm diameter, or the like). Accordingly, the substrate support 104 includes a base ring 116 and a clamp ring 114 configured to support the substrate having the given size.

Figure 2:
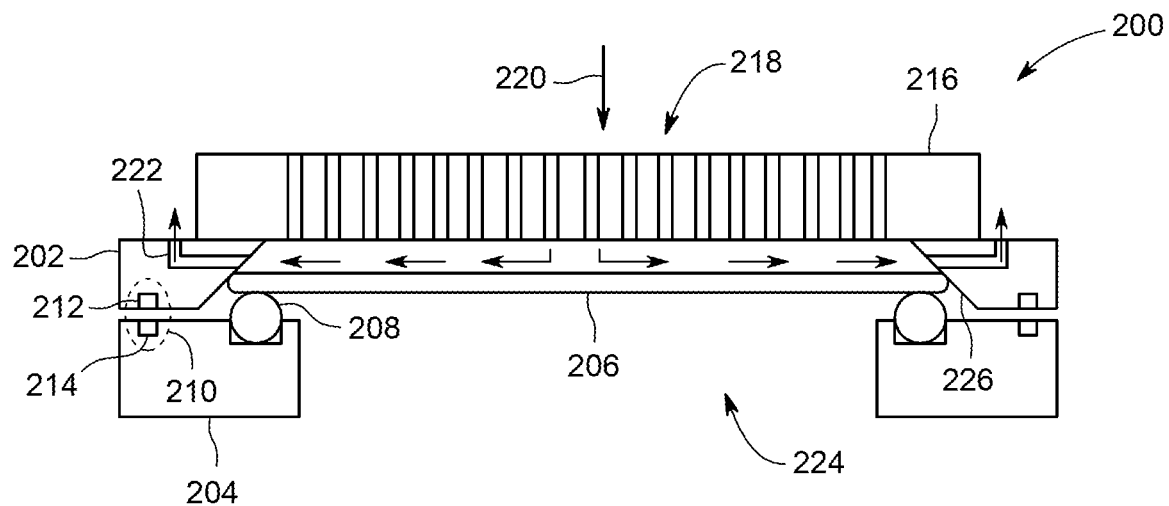
FIG. 2 is schematic view of a substrate support in accordance with at least some embodiments of the present disclosure.
Figure 3:
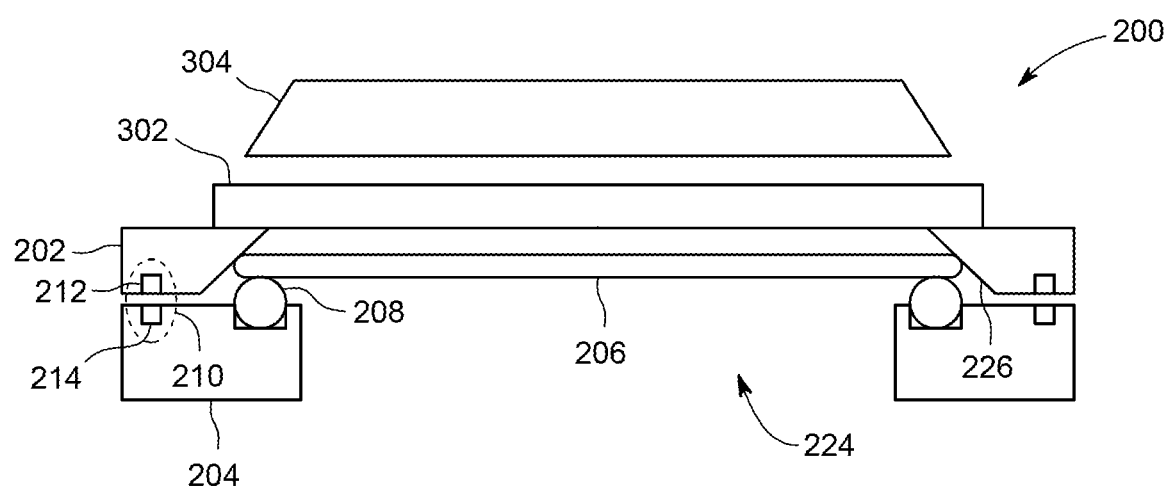
FIG. 3 is schematic view of a substrate support in accordance with at least some embodiments of the present disclosure.

For example, in some embodiments, the substrate to be cleaned may be a semiconductor or similar round wafer having a given diameter. In such embodiments, the base ring 116 has an inner diameter less than the given diameter. The base ring 116 further has a support surface configured to contact a first surface of the substrate 106 and to form a seal between the support surface and the first surface of the substrate 106, when the substrate 106 is disposed atop the base ring 116. The seal advantageously limits or prevents particles detached during the cleaning process from migrating to the front side of the substrate 106 and causing secondary contamination. In some embodiments, an elastomeric seal (as shown in FIGS. 2 and 3) may be disposed in or on the support surface of the base ring 116 along a diameter that is less than the given diameter to enhance the seal between the substrate 106 and the base ring 116. The base ring 116 may be made of any suitable process compatible material with sufficient mechanical strength to support the substrate, such as aluminum.

The clamp ring 114 has an inner diameter less than the given diameter. The clamp ring 114 further includes a contact surface proximate the inner diameter configured to contact an upper surface of the substrate 106. The clamp ring 114 and the base ring 116 are configured to provide a bias force toward each other to clamp the substrate 106 in the substrate support 104. The base ring 116 may be made of any suitable process compatible material with sufficient material characteristics to not damage the substrate when contacting the substrate, such as polytetrafluoroethylene, for example, TEFLON®.

The substrate support 104 may be coupled to the process chamber 102, for example, along a sidewall of the process chamber 102. In some embodiments, a bearing 118 may be provided between the substrate support 104 and the process chamber 102 to facilitate rotation of the substrate support 104. In some embodiments, the clamp ring 114 of the substrate support is rotatably coupled to the process chamber 102 through the bearing 118.

One or more actuators 120 may be coupled to the substrate support 104 to facilitate vertical and, in some embodiments, rotational motion of the substrate support 104. For example, the base ring 116 may be coupled to a vertical actuator to facilitate moving the base ring 116 from a raised processing position (as shown in FIG. 1) to a lower transfer position. In the lower transfer position, the base ring 116 is aligned with or lower than a door 122 (e.g., a slit valve door) formed in the process chamber 102 that selectively opens or seals an opening in a sidewall of the process chamber 102 to facilitate insertion and removal of substrates into the process chamber 102 and onto the base ring 116. The actuator 120 may further provide for rotation of the substrate support 104, or a separate actuator may be provided to control the rotational motion of the substrate support 104.

In some embodiments, the system 100 further includes a showerhead 126 or similar structure for introducing a gas from a gas supply 128 into the upper volume 110. The showerhead 126 is positioned above and opposite the position of the substrate 106 when held by the substrate support 104. The gas provided by the gas supply 128 is an inert gas, such as nitrogen gas ($N_2$), or a noble gas. In some embodiments, the showerhead 126 may be heated, such as by heating lamps, resistive heating elements, heat transfer fluids, or the like. Alternatively or in combination, the gas may be pre-heated prior to delivery into the upper volume 110 through the showerhead 126. In some embodiments, the showerhead 126 can be heated to a temperature of up to about 100 degrees Celsius, such as about 30 to about 100 degrees Celsius, or other temperature suitable for maintaining the substrate at a temperature of about 30 to about 80 degrees Celsius during operation.

Alternatively or in combination with the showerhead 126, a heater 130 may be provided in a position to provide heat to the substrate 106 during processing. For example, the heater 130 may be positioned in a central upper portion of the process chamber 102. The heater 130 may comprise a plurality of lamps, such as infrared lamps suitable for radiating heat energy toward the substrate 106 when present on the substrate support 104.

The gas provided by the showerhead 126 and/or the heat provided by the heater 130 advantageously limits or prevents contamination due to condensates forming on the substrate surface due to the subzero temperature of the cryogenic aerosol.

An exhaust pump 124 is coupled to respective vents coupled to the upper and lower volumes 110, 112 of the process chamber 102. The exhaust pump facilitates evacuating the respective upper and lower volumes to prevent contaminates removed from the substrate surface from redepositing thereon.

FIG. 2 is a more detailed schematic view of a substrate support 200 in accordance with at least some embodiments of the present disclosure. The substrate support 200 may be used as the substrate support 104 in the system 100 of FIG. 1. The substrate support 200 includes a base ring 204 and a clamp ring 202 to retain a substrate 206 therebetween. The base ring 204 and the clamp ring 202 may be used as the base ring 116 and the clamp ring 114, respectively, described above with respect to FIG. 1. The substrate 206 may be the substrate 106 described above with respect to FIG. 1.

As shown in FIG. 2, an elastomeric seal 208, such as a gasket or o-ring, is disposed between the base ring 204 and the clamp ring 202. The elastomeric seal can be made of any process compatible elastomeric material. The elastomeric seal 208 is positioned to facilitate forming a seal between the first and second sides of the substrate 206 (e.g., the backside and the front side) when the substrate 206 is clamped in the substrate support 200. In some embodiments, the elastomeric seal 208 may be disposed along a diameter that is less than the given diameter such that the elastomeric seal 208 is disposed between the base ring 204 and the substrate 206, when the substrate 206 is clamped in the substrate support 200. In some embodiments, as shown in FIG. 2, the elastomeric seal 208 may be partially disposed in a groove formed in the support surface of the base ring 204.

In some embodiments, and as shown in FIG. 2, the contact surface of the clamp ring 202 may be disposed at an inward angle (e.g., the surface is inclined in a radially inward direction from the side closest to the base ring 204 to the side facing away from the base ring 204. The inwardly angled contact surface is configured to contact the substrate 206 along the outer edge of the substrate 206 (e.g., along a bevel formed along the outer peripheral edge of the substrate 206). Such a configuration advantageously minimizes contact with the surface of the substrate 206 by the clamp ring 202.

In some embodiments, the lift actuator or motor can provide an upward force against the base ring 204 to bias the base ring 204 toward the clamp ring 202. Alternatively or in combination, a clamping mechanism 210 can be provided to assist in providing the clamping force between the base ring 204 and the clamp ring 202.

For example, in some embodiments, and as shown in FIG. 2, a one or more magnets may be provided in each of the base ring 204 and the clamp ring 202. For example, one or more magnets 212 may be disposed in the clamp ring 202 and one or more magnets 214 may be disposed in the base ring 204. The magnets may be permanent magnets and can be configured in size, location, and strength to provide sufficient attractive force between the base ring 204 and the clamp ring 202 to sealingly secure the substrate 206 therebetween. In some embodiments, each of the magnets 212, 214 are arranged in respective rings in corresponding opposing locations in the base ring 204 and the clamp ring 202.

In some embodiments, and as shown in FIG. 2, a plurality of vents 222 are formed through the clamp ring 202 to facilitate removal of gas provided to the second side of the substrate 206 by the showerhead. In some embodiments, each vent 222 runs from a point along an inner diametral surface of the clamp ring 202 having a diameter less than the given diameter of the substrate 206, to an upper surface of the clamp ring 202. Any suitable number of vents 222 can be provided dependent upon the gas flow provided to the substrate 206 from the showerhead. In some embodiments, four vents 222 are provided. The vents 222 may be arranged around the clamp ring 202 in any suitable configuration to exhaust the gas from the second side of the substrate 206, such as axisymmetrically.

As shown in FIG. 2, a showerhead 216 (which can be the showerhead 126 shown in FIG. 1) is disposed proximate the clamp ring 202. The showerhead 216 includes a plurality of gas distribution holes 218 to provide gas from the gas source to the second side of the substrate 206 (as indicated by arrow 220). In some embodiments, the showerhead 216 includes a heater, such as one or more resistive heating elements. In some embodiments, the showerhead 216 may be disposed atop the clamp ring 202. In some embodiments, the showerhead 216 may be disposed close to but not touching the clamp ring 202 such that a small gap is formed between the showerhead 216 and the clamp ring 202. Positioning the showerhead 216 near the clamp ring 202 without touching the clamp ring 202 advantageously facilitates rotation of the substrate support 200 without needing to rotate the showerhead 216. Moreover, the close positioning of the showerhead 216 to the clamp ring 202 facilitates higher gas flows and higher heat transfer to the substrate 206 during processing, which advantageously reduces the risk of contamination of the second side of the substrate 206 due to condensation on the second side of the substrate 206.

FIG. 3 is a more detailed schematic view of a substrate support 300 in accordance with at least some embodiments of the present disclosure. The substrate support 300 may be used as the substrate support 104 in the system 100 of FIG. 1. The substrate support 300 includes the base ring 204 and the clamp ring 202 to retain the substrate 206 therebetween. Where identical reference numerals are provided, the substrate support 300 is as described with respect to the substrate support 200 discussed above.

In some embodiments, and as shown in FIG. 3, a radiant heater 304 may be disposed opposite the substrate support 300 in a position to provide heat to the second side of the substrate 206 during processing. The radiant heater 304 may be the heater 130 discussed above with respect to FIG. 1. For example, the radiant heater 304 may be positioned in a central upper portion of the process chamber 102. The radiant heater 304 may comprise a plurality of lamps, such as infrared lamps, suitable for providing radiant energy toward the substrate 206 when present on the substrate support 300.

In some embodiments, and as shown in FIG. 3, a transparent window 302 may be disposed atop the clamp ring 202 and covering a central opening of the clamp ring 202. The transparent window 302 is transparent to the radiant energy provided by the radiant heater 304. In some embodiments, the transparent window 302 is formed of quartz. The transparent window 302 may seal the central opening of the clamp ring 202 such that the second side of the substrate 206 is isolated (e.g., isolated from the upper volume 110 and the lower volume 112 of the process chamber 102). Keeping the second side of the substrate 206 isolated during the processing advantageously limits or prevents contamination of the second side of the substrate from the process while still reducing the risk of contamination of the second side of the substrate 206 due to condensation. The substrate support 300 can advantageously be used in applications where the substrate is not very reflective or otherwise more efficiently absorbs the radiant energy provided by the radiant heater 304.

In operation of the system 100, the base ring 116 is lowered and a substrate is placed thereon through the door 122. The door 122 is then sealed and the base ring 116 raised to clamp the substrate 106 between the base ring 116 and the clamp ring 114. In embodiments with the showerhead 126, 216, a gas flow may be initiated. In embodiments with a heated showerhead 126, 216 and/or with the heater 130, 304, the heater may be turned on or ramped up to the setpoint.

Next, the nozzle 132 may be moved into position and flow of gas from the cleaning material source 134 is initiated to discharge the cryogenic aerosol jet toward the backside of the substrate 106. The nozzle 132 may further be moved laterally and the substrate 106 may be rotated to clean the desired portions or the entire first surface of the substrate 106. Upon completion of cleaning, the cleaning material source 134 may be turned off and the substrate 106 may be lowered and removed from the chamber through the door 122.

Thus, embodiments of substrate supports have been disclosed. Embodiments of the inventive substrate supports may advantageously be used in cryogenic aerosol jet cleaning processes as described above. In some embodiments, a substrate support includes a base ring having an elastomer seal and an opposing clamp ring which advantageously provides gas sealing at the substrate backside edge. In some embodiments, the clamp ring advantageously minimizes contact with the substrate only along the outer bevel. In some embodiments, a heated showerhead substantially covers substrate top and provides an inert gas flow through the showerhead to the tope surface of the substrate. In some embodiments, in addition to the showerhead or without a showerhead a heater may be provided to heat the substrate. In some embodiments, the heater may be provided without the showerhead and a transparent window may be disposed atop the clamp ring to isolate the top surface of the substrate. Embodiments of the inventive substrate support advantageously confine the cryogenic aerosol jet to the lower surface of the substrate, which limits or prevents contaminants from reaching the top side of the substrate. Embodiments of the inventive substrate support further advantageously heat the substrate to limit or prevent condensation type contaminants from forming on the front side of the substrate.

While the foregoing is directed to embodiments of the present disclosure, other and further embodiments of the disclosure may be devised without departing from the basic scope thereof.

The invention claimed is:

1. A process chamber, comprising:
   a substrate support, comprising:
      a base ring having an inner diameter less than a given diameter, the base ring having a support surface configured to contact a first surface of the substrate and to form a seal between the support surface and the first surface of the substrate, when disposed atop the base ring; and
      a clamp ring having an inner diameter less than the given diameter, wherein the clamp ring includes an angled contact surface proximate the inner diameter configured to contact an upper surface of the substrate, when present, and wherein the clamp ring and the base ring are further configured to provide a bias force toward each other to clamp the substrate in the substrate support, wherein a plurality of vents are formed through the clamp ring from the angled contact surface to an upper surface of the clamp ring, and wherein an inner diameter of the base ring is less than an inner diameter of the clamp ring; and
   a showerhead disposed atop or above the clamp ring and covering a central opening of the clamp ring.

2. The process chamber of claim 1, further comprising:
an elastomeric seal disposed in or on the support surface of the base ring along a diameter that is less than the given diameter.

3. The process chamber of claim 1, wherein the angled contact surface of the clamp ring is disposed at an inward angle such that the angled contact surface contacts the substrate along an outer edge of the substrate when the substrate is present.

4. The process chamber of claim 1, wherein the base ring is made of polytetrafluoroethylene.

5. The process chamber of claim 1, further comprising one or more magnets disposed in each of the base ring and the clamp ring to provide an attractive force between the base ring and the clamp ring.

6. The process chamber of claim 5, wherein the one or more magnets disposed in each of the base ring and the clamp ring are disposed in corresponding opposing locations in the base ring and the clamp ring.

7. A process chamber for cleaning a backside of a substrate, comprising:
the process chamber of claim 1, wherein the substrate support separates an interior volume of the process chamber into an upper volume disposed above the substrate support and a lower volume disposed below the substrate support; and
a cryogenic cleaning apparatus disposed in the lower volume and configured to provide a stream of cleaning materials toward the backside of the substrate to be cleaned, wherein the cryogenic cleaning apparatus includes a movable arm and a nozzle.

8. The process chamber of claim 7, wherein the movable arm is configured to move the nozzle at least between a center and an outer peripheral edge of the substrate.

9. The process chamber of claim 7, wherein the nozzle is disposed at a distance of about 0.5 to about 2.0 inches away from the first surface of the substrate.

10. The process chamber of claim 7, further comprising a cleaning material source coupled to the nozzle.

11. The process chamber of claim 10, wherein the cleaning material source includes liquid carbon dioxide ($CO_2$), nitrogen ($N_2$), argon (Ar), or neon (Ne).

12. The process chamber of claim 7, further comprising an actuator coupled to the substrate support to facilitate at least one of vertical or rotational motion of the substrate support.

13. The process chamber of claim 12, wherein the actuator provides an upward force against the base ring to bias the base ring toward the clamp ring.

14. The process chamber of claim 12, wherein the base ring is coupled to the actuator to facilitate moving the base ring from a raised processing position to a lower transfer position where the base ring is aligned with or lower than a door formed in the process chamber.

15. A substrate support to support a substrate having a given diameter, comprising:
a base ring having an inner diameter less than the given diameter, the base ring having a support surface configured to contact a first surface of the substrate and to form a seal between the support surface and the first surface of the substrate, when disposed atop the base ring;
a clamp ring having an inner diameter less than the given diameter, wherein the clamp ring includes a contact surface proximate the inner diameter configured to contact an upper surface of the substrate, when present, and wherein the clamp ring and the base ring are further configured to provide a bias force toward each other to clamp the substrate in the substrate support; and
a window transparent to radiant energy disposed atop the clamp ring and covering a central opening of the clamp ring.

16. The substrate support of claim 15, further comprising one or more magnets disposed in each of the base ring and the clamp ring to provide an attractive force between the base ring and the clamp ring.

17. The substrate support of claim 15, further comprising an elastomeric seal disposed in or on the support surface of the base ring along a diameter that is less than the given diameter.

18. The substrate support of claim 17, wherein the elastomeric seal is disposed radially inward of one or more magnets of the base ring.

* * * * *